(12) United States Patent
Chu

(10) Patent No.: US 9,960,562 B2
(45) Date of Patent: May 1, 2018

(54) CIRCUIT BOARD ACTUATOR SYSTEM

(71) Applicant: Facebook, Inc., Menlo Park, CA (US)

(72) Inventor: Renee Chu, San Francisco, CA (US)

(73) Assignee: Facebook, Inc., Menlo Park, CA (US)

( * ) Notice: Subject to any disclaimer, the term of this patent is extended or adjusted under 35 U.S.C. 154(b) by 196 days.

(21) Appl. No.: 14/704,166

(22) Filed: May 5, 2015

(65) Prior Publication Data

US 2016/0261083 A1    Sep. 8, 2016

Related U.S. Application Data

(60) Provisional application No. 62/129,592, filed on Mar. 6, 2015.

(51) Int. Cl.
| | |
|---|---|
| *H05K 5/00* | (2006.01) |
| *H01R 43/20* | (2006.01) |
| *H05K 7/14* | (2006.01) |
| *H05K 7/20* | (2006.01) |

(52) U.S. Cl.
CPC ......... *H01R 43/205* (2013.01); *H05K 7/1409* (2013.01); *H05K 7/1489* (2013.01); *H05K 7/20736* (2013.01)

(58) Field of Classification Search
CPC ........ B29D 11/00807; B29D 11/00894; H05K 3/30; H01R 4/18; H01R 4/70; H01R 43/005; H01R 43/048
See application file for complete search history.

(56) References Cited

U.S. PATENT DOCUMENTS

| | | | | |
|---|---|---|---|---|
| 3,853,379 A | * | 12/1974 | Goodman | H01R 12/89 361/801 |
| 4,256,356 A | * | 3/1981 | Roth | H05K 7/1409 312/101 |
| 5,214,567 A | | 5/1993 | Feightner et al. | |
| 5,302,133 A | * | 4/1994 | Tondreault | H01R 13/633 439/157 |
| 5,848,906 A | * | 12/1998 | Glusker | H01R 13/629 361/756 |

(Continued)

OTHER PUBLICATIONS

Non-Final Office Action dated Oct. 6, 2015, for U.S. Appl. No. 14/300,821 of Ehlen, J., et al. filed Jun. 10, 2014.

(Continued)

*Primary Examiner* — Minh Trinh
(74) *Attorney, Agent, or Firm* — FisherBroyles, LLP

(57) ABSTRACT

Technology is provided for circuit board actuator systems for ejecting and inserting a circuit board into a circuit board connector. The actuator system includes a cross-member attached to a circuit board and a pair of levers pivotably coupled to opposite end portions of the cross-member. Each lever is moveable between a closed position and an open position and includes an arm with an insertion pawl and an ejector pawl extending from the arm. The system further includes a pair of circuit board guides, each including a keeper and mountable adjacent a circuit board connector. The insertion pawls operate against the keepers to insert the circuit board into the connector when the levers are moved toward the closed position, and the ejector pawls operate against the keepers to eject the circuit board from the connector when the levers are moved toward the open position.

20 Claims, 8 Drawing Sheets

(56) References Cited

U.S. PATENT DOCUMENTS

| | | | |
|---|---|---|---|
| 6,459,571 B1 | 10/2002 | Carteau et al. | |
| 6,625,035 B1 * | 9/2003 | Steinman | H05K 7/1409 361/726 |
| 6,685,489 B1 | 2/2004 | Rubenstein et al. | |
| 7,375,923 B2 | 5/2008 | DeCenzo et al. | |
| 7,583,507 B2 | 9/2009 | Starr et al. | |
| 7,864,519 B2 | 1/2011 | Lin et al. | |
| 9,532,480 B2 | 12/2016 | Shen et al. | |
| 9,538,683 B2 | 1/2017 | Ehlen et al. | |
| 9,807,901 B2 | 10/2017 | Ehlen et al. | |
| 2001/0043432 A1 * | 11/2001 | Hamatsu | G11B 17/0282 360/99.02 |
| 2004/0264146 A1 | 12/2004 | Kerrigan et al. | |
| 2007/0247804 A1 | 10/2007 | Li et al. | |
| 2013/0050955 A1 | 2/2013 | Shinsato et al. | |
| 2014/0203696 A1 | 7/2014 | Rust et al. | |
| 2014/0204537 A1 | 7/2014 | Rust et al. | |
| 2014/0265794 A1 | 9/2014 | Schroeder et al. | |
| 2015/0208543 A1 | 7/2015 | Chen et al. | |
| 2015/0359125 A1 | 12/2015 | Ehlen et al. | |
| 2016/0262282 A1 * | 9/2016 | Li | H01R 43/205 |
| 2016/0381824 A1 * | 12/2016 | Chu | H05K 7/1487 361/679.32 |

OTHER PUBLICATIONS

U.S. Appl. No. 15/063,024 by Li, H. et al., filed Mar. 7, 2016.
Final Office Action dated Apr. 20, 2016, for U.S. Appl. No. 14/300,821 of Ehlen, J. et al., filed Jun. 10, 2014.
U.S. Appl. No. 14/258,929 by Ehlen, J. et al., filed Sep. 7, 2016.
U.S. Appl. No. 15/286,241 by Ehlen, J. et al., filed Oct. 5, 2016.
Non-Final Office Action dated Apr. 28, 2017, for U.S. Appl. No. 15/063,024 of Li, H. et al., filed Mar. 7, 2016.
U.S. Appl. No. 14/300,821 of Chu, R. filed May 5, 2015.
Notice of Allowance dated Aug. 14, 2017 for U.S. Appl. No. 15/063,024 of Li, H. et al., filed Mar. 7, 2016.
Notice of Allowance dated Aug. 21, 2017 for U.S. Appl. No. 15/258,929 of Ehlen, J. et al., filed Sep. 7, 2016.
Corrected Notice of Allowability dated Dec. 8, 2017 for U.S. Appl. No. 15/063,024 of Li, H. et al., filed Mar. 7, 2016.

* cited by examiner

CIRCUIT BOARD ACTUATOR SYSTEM

CROSS-REFERENCE TO RELATED APPLICATIONS

This application claims the benefit of U.S. Provisional Patent Application No. 62/129,592, filed Mar. 6, 2015, the disclosure of which is incorporated herein by reference in its entirety.

TECHNICAL FIELD

This patent application is directed to data storage server configurations and, more specifically, to a circuit board actuator system.

BACKGROUND

It is normally difficult to move a circuit board into or out of its connector by hand. A circuit board ejector is often used to provide mechanical advantage for the ejection or insertion of a circuit board into its connector. Conventional circuit board ejectors are functional; however, they typically only either eject or insert a circuit board into its corresponding connector. In addition, conventional ejectors often lack features for retaining the ejectors in a closed position. Therefore, there is need for circuit board actuator systems that can eject and insert a circuit board into and out of its connector, as well as provide features for retaining the ejectors in a closed position.

BRIEF DESCRIPTION OF THE DRAWINGS

The circuit board actuator systems introduced herein may be better understood by referring to the following Detailed Description in conjunction with the accompanying drawings, in which like reference numerals indicate identical or functionally similar elements.

Figure 1:
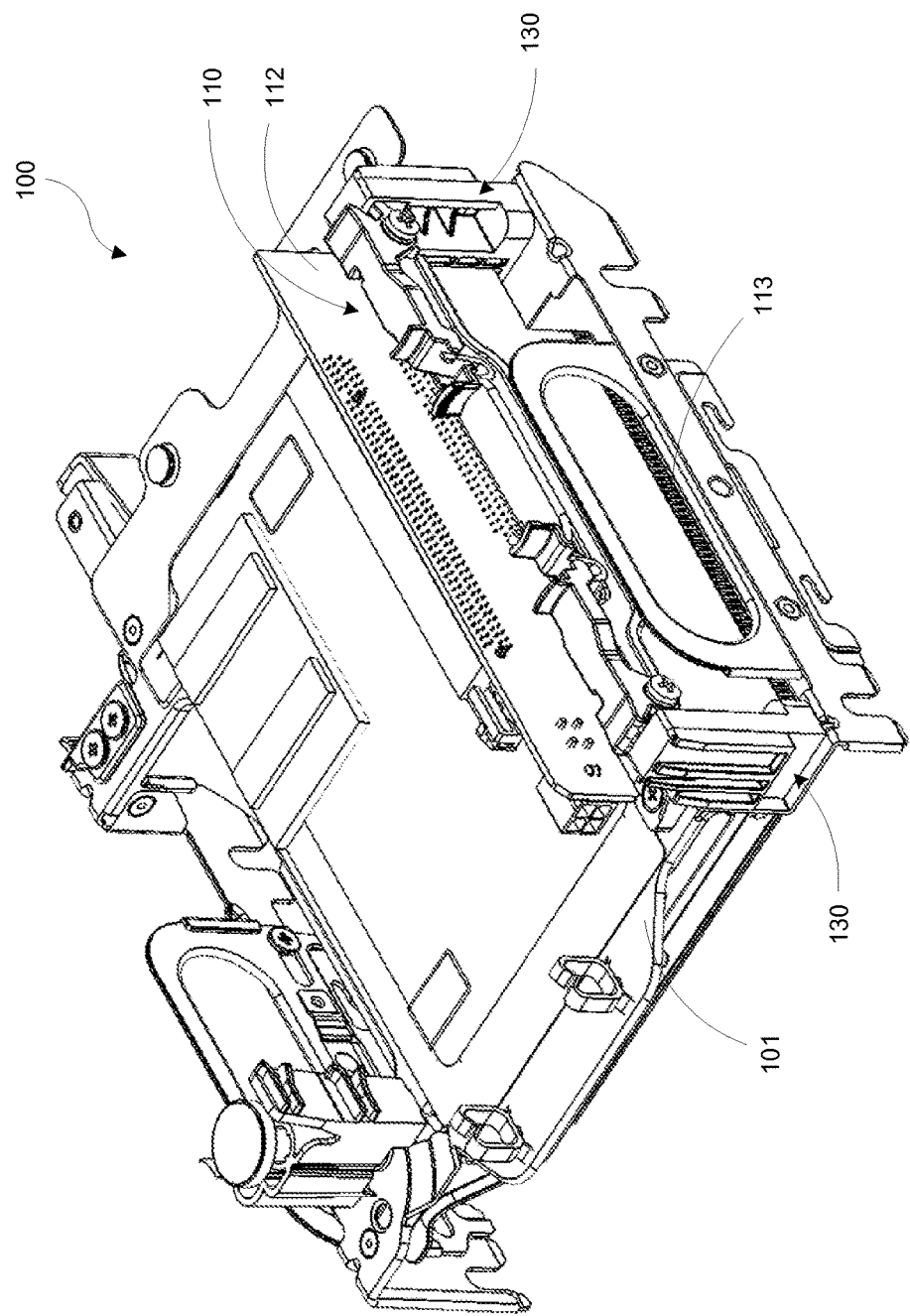
FIG. 1 is a perspective view of a hard disc drive assembly including a circuit board having a circuit board actuator system according to a representative embodiment.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to limit the embodiments described. On the contrary, the embodiments are intended to cover all modifications, equivalents, and alternatives falling within the scope of the embodiments as defined by the appended claims.

DETAILED DESCRIPTION

Overview

A circuit board actuator system is disclosed for ejecting and inserting a circuit board into a circuit board connector. In some embodiments, the circuit board actuator system includes a cross-member attached to the circuit board and a pair of levers pivotably coupled to opposite end portions of the cross-member. Each lever is moveable between a closed position and an open position and includes an arm, an insertion pawl extending from a first end portion of the arm, an ejector pawl opposite the insertion pawl, and a latch disposed on a second end portion of the arm and configured to engage a catch on the cross-member when the lever is in the closed position. In some embodiments, the circuit board actuator system further includes a pair of circuit board guides, each including a keeper, and mountable adjacent a circuit board connector. The insertion pawls operate against the keepers to insert the circuit board into the circuit board connector when the levers are moved toward the closed position, and the ejector pawls operate against the keepers to eject the circuit board from the circuit board connector when the levers are moved toward the open position. The arms cooperate with the pawls to provide a mechanical advantage for inserting and ejecting the circuit board into and out of its connector. This mechanical advantage reduces the amount of force a user must apply to insert or eject the circuit board. The actuator system also applies the force evenly across the circuit board. Accordingly, the actuator system reduces the potential to bend or otherwise stress the circuit board during insertion and ejection.

General Description

Various examples of the devices introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

FIG. 1 illustrates a hard disc drive assembly 100 that includes a circuit board 112 having a circuit board actuator system 110 to facilitate ejecting and inserting the contacts 113 of circuit board 112 into a circuit board connector on an associated motherboard (not shown). The circuit board actuator system 110 is mounted to the chassis 101 of the hard disc drive assembly 100 by a pair of spaced apart circuit board guides 130.

Figure 2:
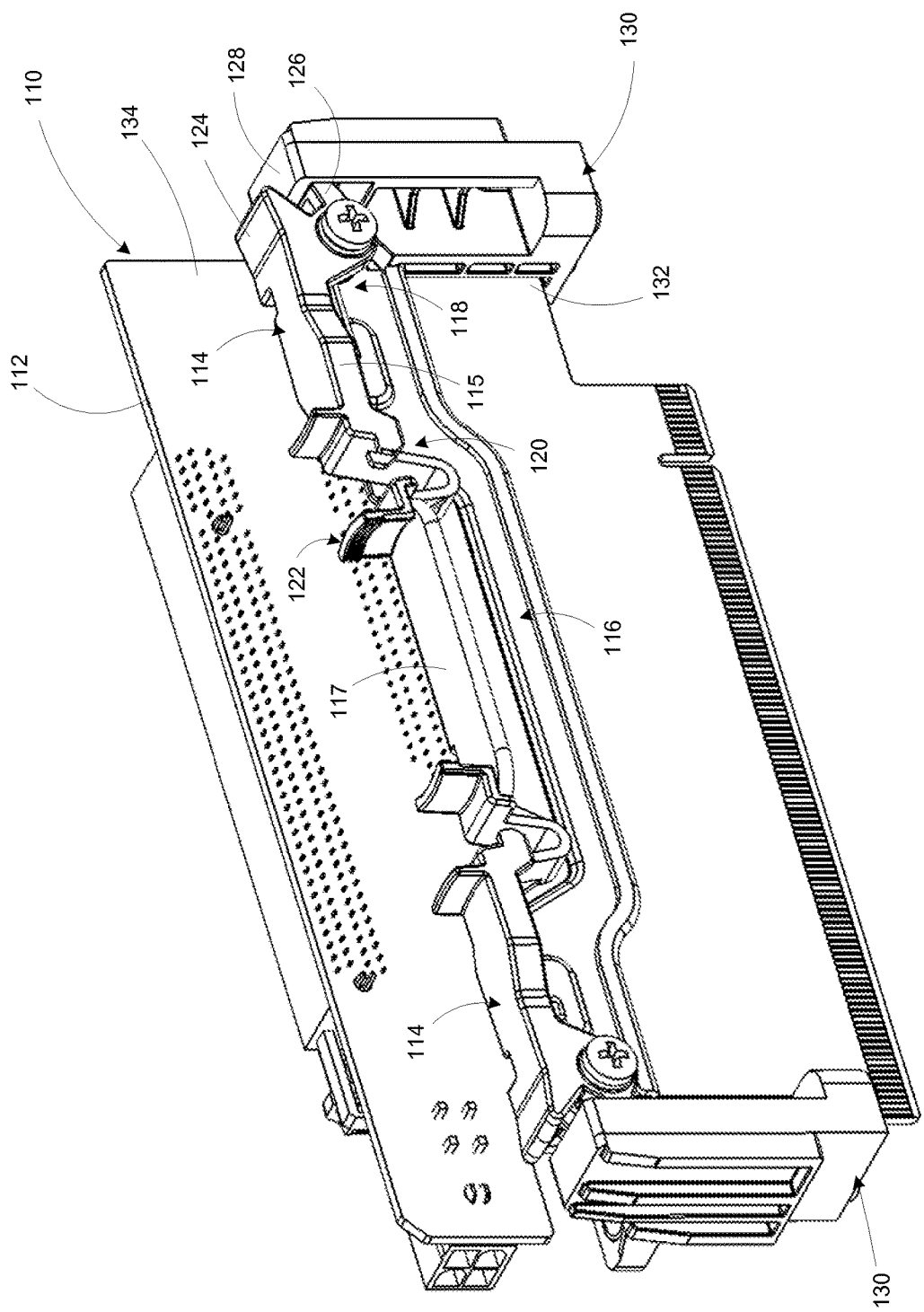
FIG. 2 is a perspective view of the circuit board and circuit board actuator system shown in FIG. 1.

As shown in FIG. 2, the circuit board actuator system 110 includes a cross-member 116 that is attached to the side of circuit board 112. A pair of levers 114 are pivotably coupled to opposite end portions of the cross-member 116. Each lever 114 includes an arm 115 having a first end portion 118 and a second end portion 120. A pair of opposed pawls 124 and 126 extend from the first end portion 118 of the arm 115. A latch 122 is disposed on the second end portion 120 and is configured to releasably engage a catch portion 117 on the cross-member 116 when the lever is in the closed and locked position, as shown in FIG. 2. In some embodiments, the catch portion 117 is in the form of a flange extending orthogonally from the cross-member 116. In some embodiments, the pair of levers 114 are pivotably coupled to the circuit board 112 adjacent to opposite end portions of the circuit board. Similarly, the catch portion 117 can be separately attached to the circuit board between the pair of levers 114.

The circuit board guides 130 are positioned adjacent the circuit board connector. Each circuit board guide 130 includes a groove 132 that is sized and configured to receive an edge margin 134 of the circuit board 112. Each circuit board guide 130 also includes a keeper 128 against which the pawls 124 and 126 operate to eject and insert the circuit board 112 into the circuit board connector when the levers 114 are moved between the open and closed positions. In some embodiments, the keeper 128 is oriented orthogonally with respect to groove 132.

Figure 3:
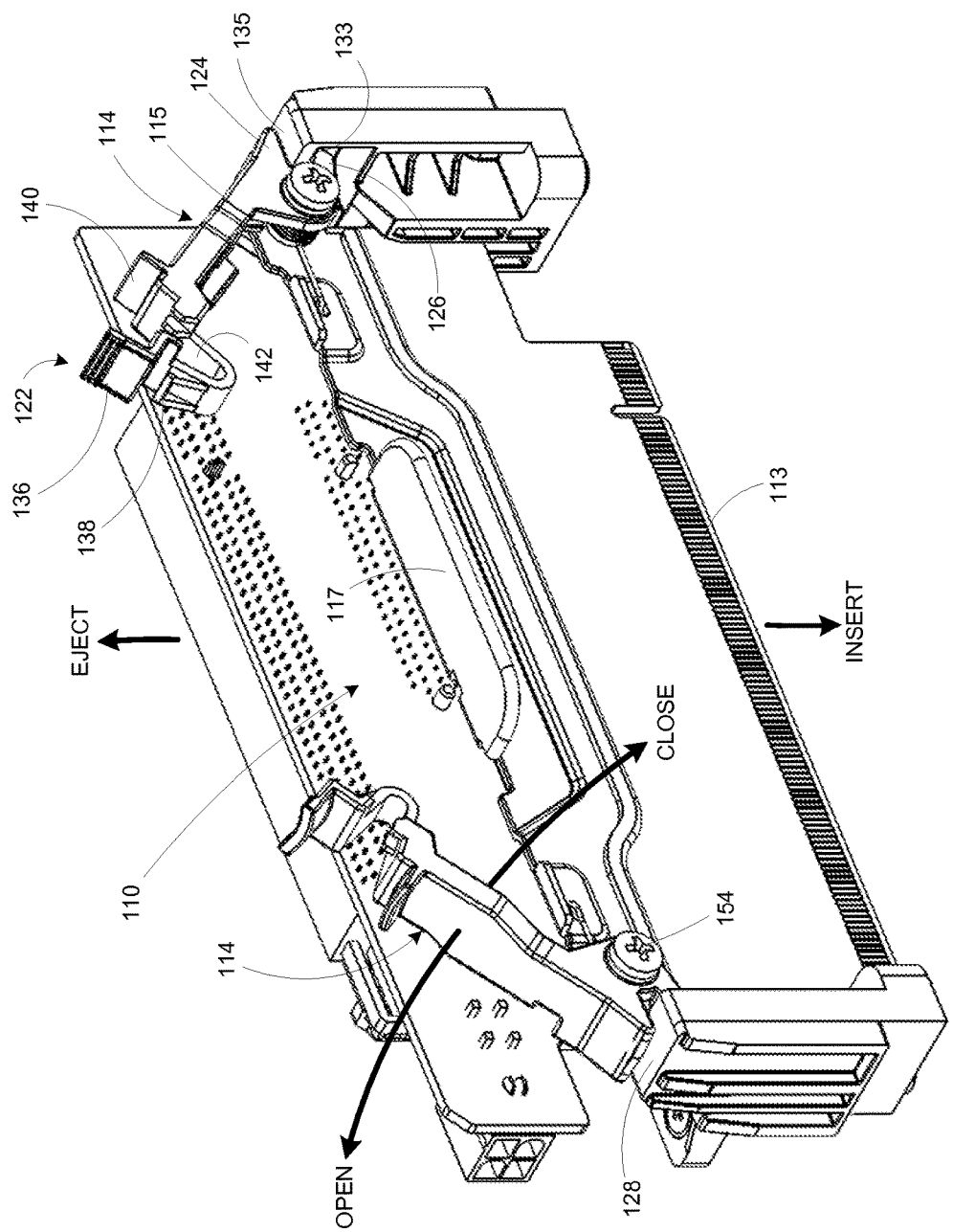
FIG. 3 is a perspective view of the circuit board actuator system shown in FIGS. 1 and 2 illustrating the circuit board in a partially inserted position.

As can be appreciated in FIG. 3, the levers 114 are moveably positioned between fully open and fully closed positions. Each lever 114 is attached to the cross-member 116 by a suitable fastener 154 that is spaced apart from the pawls 124 and 126. When the circuit board is moved into the guides 130, each lever 114 is in the open position so that the pawls 124 and 126 are adjacent to the keeper 128. As lever 114 pivots about fastener 154 and moves towards the closed position, the insertion pawl 126 moves to engage with a first surface 133 of the keeper 128. As the lever approaches the closed position, the insertion pawl 126 presses against the keeper to apply force to the circuit board 112 to move the circuit board 112 in the insert direction in order to install the circuit board contacts 113 into an associated circuit board connector. When lever 114 is moved away from the closed position and towards the open position, the lever pivots about fastener 154, and the insertion pawl moves away from and out of engagement with the first surface 133 of the keeper 128. Substantially simultaneously, the ejector pawl 124 rotates towards and into engagement with a second surface 135 of the keeper 128 opposite the first surface 133. As the lever 114 continues to move away from the closed position, ejector pawl 124 operates against the second surface 135 of the keeper 128 in order to lift or otherwise move the circuit board in the eject direction, thereby removing contacts 113 from the circuit board connector.

The latch 122 includes a release tab 136 that is operable to disengage the latch 122 from the catch 117 when activated by a user. In some embodiments, the latch 122 includes a tooth 138 disposed on the release tab 136 and configured to engage the catch 117. In this embodiment, the tooth 138 and release tab 136 are connected to arm 115 by a spring portion 142. Latch 122 may also include a grip tab 140 that facilitates squeezing the release tab 136 between a user's thumb and forefinger to compress the spring portion and unlock the latch 122 by moving the tooth 138 laterally out of interference with the under surface of the catch portion 117.

Figure 4:
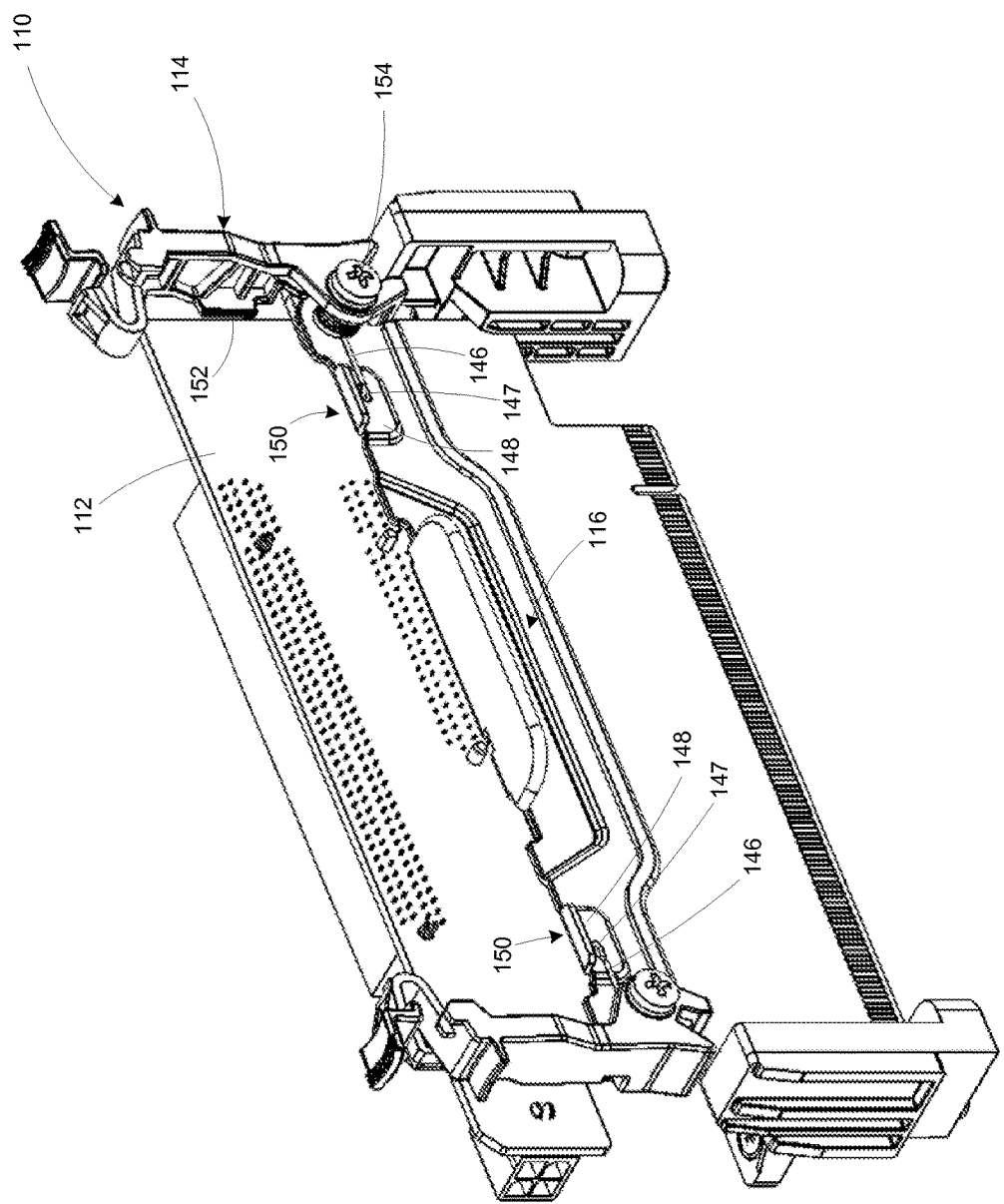
FIG. 4 is a perspective view of the circuit board actuator system illustrating the circuit board actuator system in a fully open position.

As mentioned above, the levers 114 are moveable between a fully closed position as shown in FIG. 2, and a fully open position as shown in FIG. 4. When levers 114 are in the fully closed position, circuit board 112 is fully inserted into its corresponding circuit board connector. FIG. 4 shows the circuit board actuator system 110 in the fully open and ejected configuration. In some embodiments, the levers 114 are maintained or biased towards the open position by a resilient member 146. As shown in this embodiment, the resilient member 146 is in the form of a torsion spring positioned on fastener 154 and inserted into an aperture 147 formed in pocket 148. Pocket 148 provides clearance for resilient member 146 to extend through aperture 147 and also provides an opening 150 to receive locator tab 152.

Figure 5:
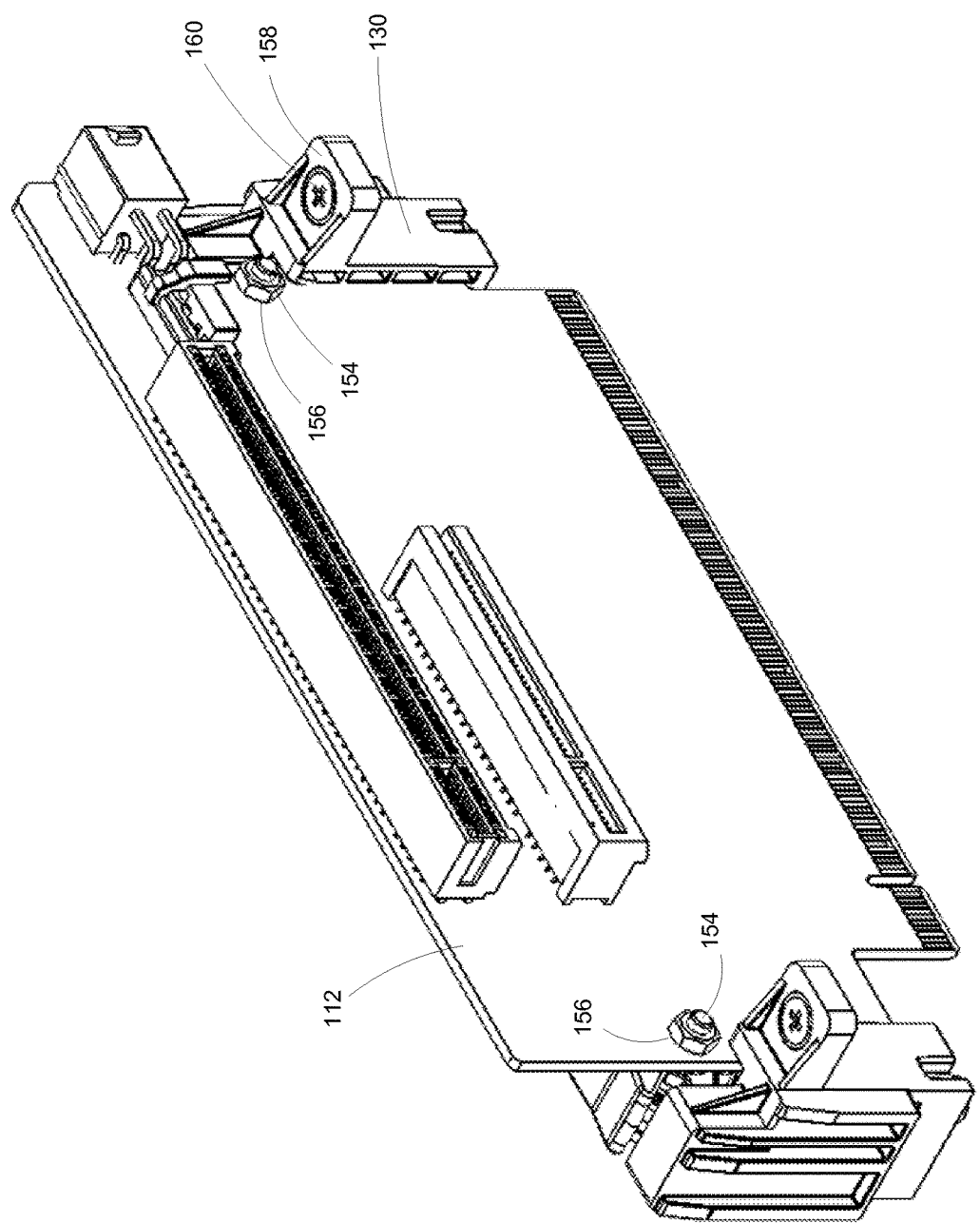
FIG. 5 is a perspective view of the circuit board as viewed from the back side.

Moving to FIG. 5, it can be appreciated that fastener 154 also attaches cross-member 116 to circuit board 112. Accordingly, a nut 156 can be attached to the fastener 154. In some embodiments, circuit board guides 130 each include a boss 158 to facilitate attaching the circuit board actuator system 110 adjacent a circuit board connector to either a motherboard, or as in this case, to an ancillary structure such as the hard disc drive chassis 101 (see FIG. 1). Accordingly, a suitable fastener 160 can be used to attach the circuit board guides 130 to a corresponding motherboard or chassis.

Figure 6:
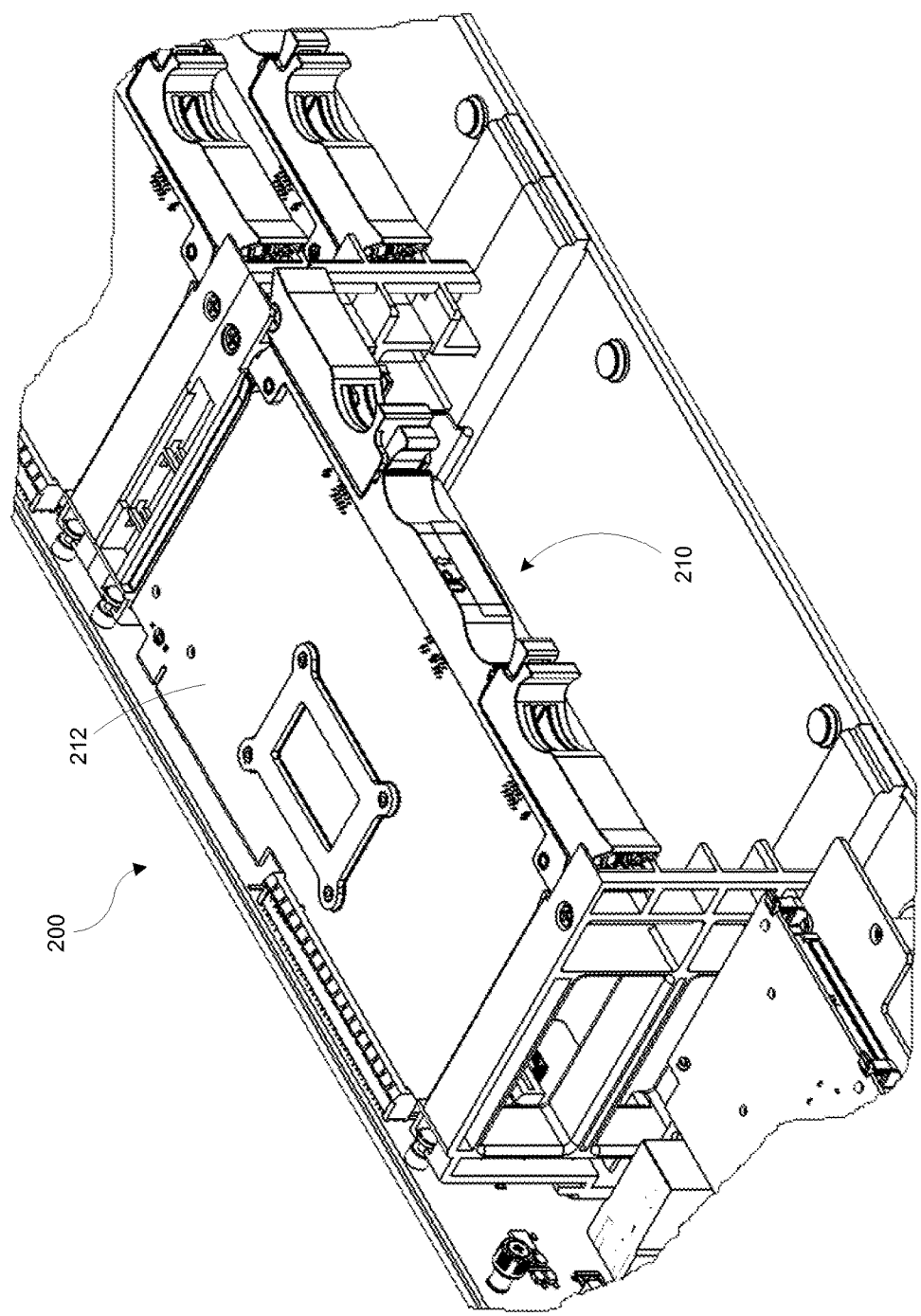
FIG. 6 is a partial perspective view of a circuit board and a circuit board actuator system according to another representative embodiment.
Figure 7:
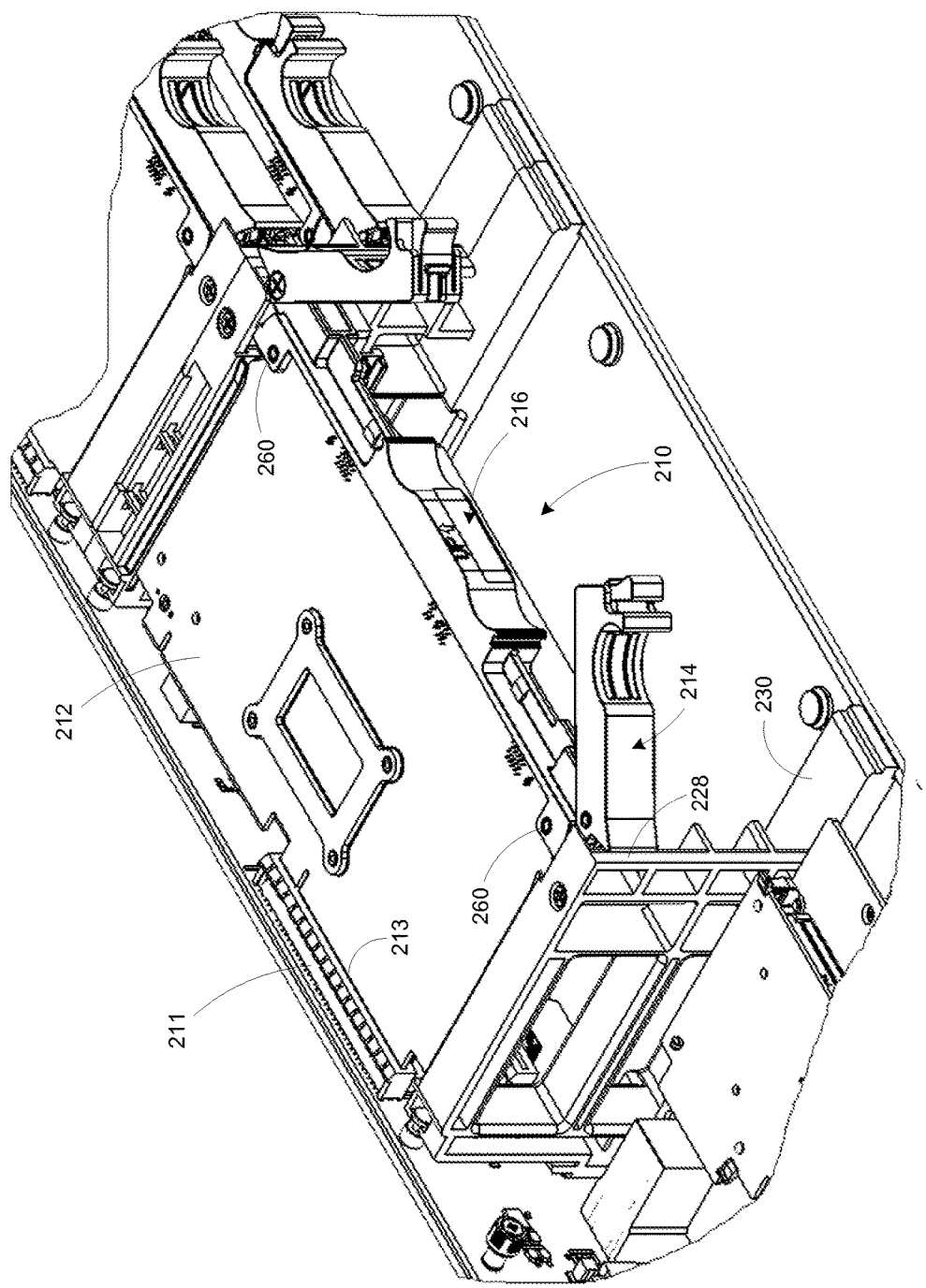
FIG. 7 is a partial perspective view of the circuit board actuator system shown in FIG. 6 in a partially inserted position.

While the circuit board actuator system has thus far been described with respect to a vertically oriented circuit board, the circuit board actuator system can also be applied to a horizontally oriented circuit board. As shown in FIG. 6, server assembly 200 includes a plurality of horizontally oriented server cards 212 that incorporate a circuit board actuator system 210 according to another representative embodiment. As shown in FIG. 7, the circuit board actuator system 210 includes a cross-member 216 and levers 214 pivotably coupled to the cross-member 216. The cross-member 216 is attached to the edge of circuit board 212 with suitable fasteners 260. The circuit board actuator system 210 includes a pair of circuit board guides 230 that each include a keeper 228 against which levers 214 act to insert and eject the circuit board connector 213 from a mating connector 211.

Figure 8:
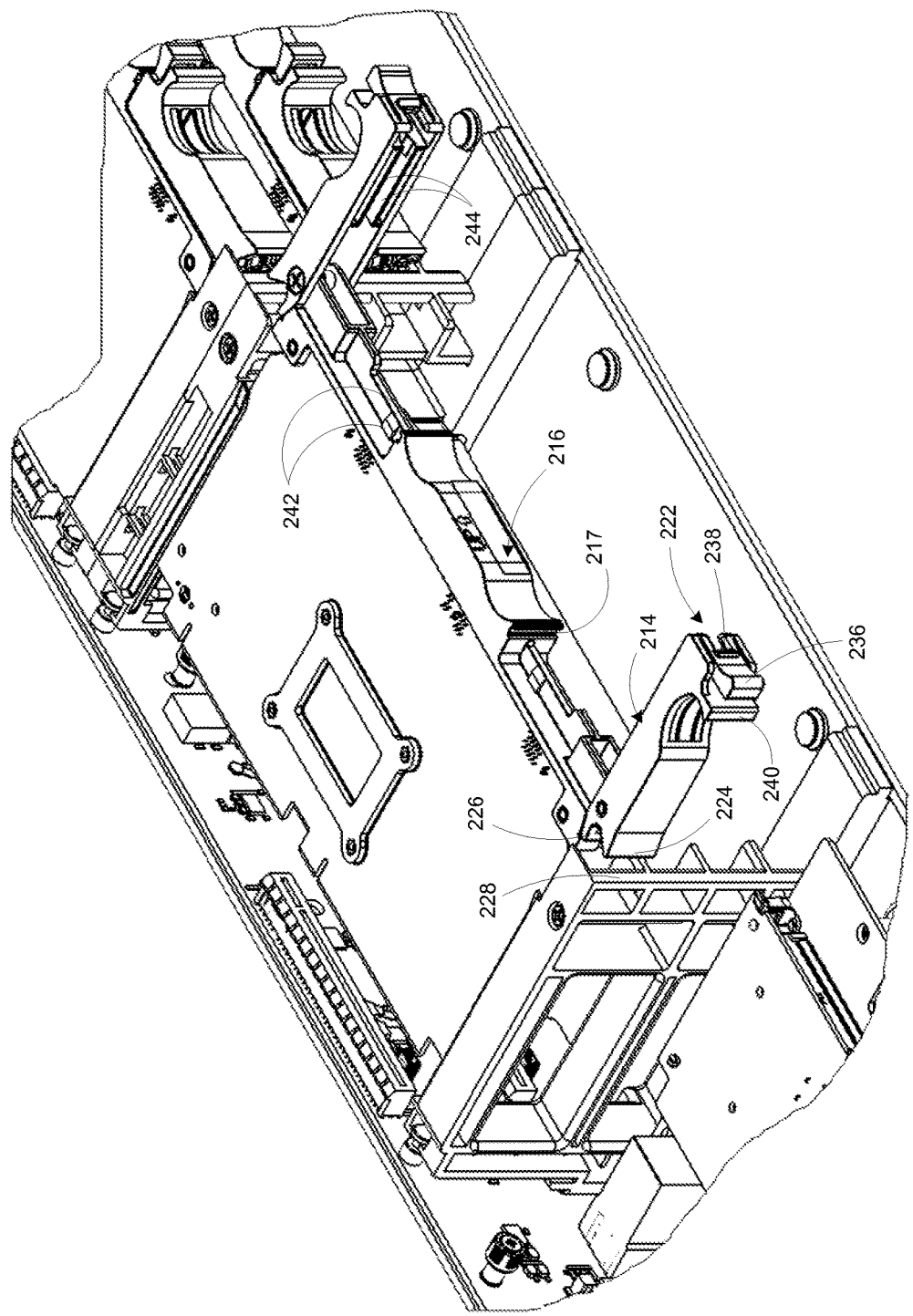
FIG. 8 is a partial perspective view illustrating the circuit board actuator system in a fully open position.

As shown in FIG. 8, each lever 214 includes an insertion pawl 226 and an ejector pawl 224, each of which operates against keeper 228 to insert and eject circuit board 212, respectively. Each lever 214 includes a latch 222 that includes a release tab 236 and a tooth 238. Each tooth 238 engages a corresponding catch groove 217 formed in cross-member 216. Release tab 236 can be depressed to release tooth 238 from catch groove 217. Each lever 214 also includes a grip tab 240 to facilitate squeezing the release tab 236. In some embodiments, cross-member 216 includes alignment wedges 242 that interface with alignment bars 244 included on levers 214.

The various components of the disclosed circuit board actuator systems can be comprised of any suitable material. For example, the levers 114 and 214 and circuit board guides 130 and 230 can comprise plastic or metal. In some embodiments, the levers 114 and 214 comprise molded plastic. In some embodiments, the cross-member 116 comprises sheet metal, and in other embodiments, the cross-member 216 comprises molded plastic.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A circuit board actuator for ejecting and inserting a circuit board into a circuit board connector, comprising:
    a cross-member attachable to a circuit board, the cross-member having a catch portion; and
    at least one lever pivotably coupled to the cross-member and moveable between a closed position and an open position, including:
        an arm;
        a pair of opposed pawls extending from a first end portion of the arm; and
        a latch disposed on a second end portion of the arm and configured to engage the catch portion on the cross-member when the at least one lever is in the closed position, wherein the latch includes:
            a release tab operable to disengage the latch from the catch when activated by a user; and
            a tooth disposed on the release tab configured to engage the catch portion.

2. The circuit board actuator of claim 1, wherein the catch portion comprises a catch groove formed in the cross-member.

3. The circuit board actuator of claim 1, wherein the catch portion comprises a flange extending from the cross-member.

4. The circuit board actuator of claim 1, wherein the pair of opposed pawls include an insertion pawl and an ejector pawl.

5. The circuit board actuator of claim 1, wherein the cross-member is attachable along an edge of the circuit board.

6. The circuit board actuator of claim 1, wherein the cross-member is attachable to a side surface of the circuit board.

7. The circuit board actuator of claim 1, wherein the at least one lever is pivotably coupled to the cross-member by a fastener.

8. The circuit board actuator of claim 7, wherein the fastener is operable to mount the cross-member to the circuit board.

9. The circuit board actuator of claim 1, including a resilient member positioned between the at least one lever and the cross-member to urge the at least one lever toward the open position.

10. A circuit board actuator for ejecting and inserting a circuit board into a circuit board connector, comprising:
    a cross-member attachable to a circuit board, the cross-member having a catch portion; and
    at least one lever pivotably coupled to the cross-member and moveable between a closed position and an open position, including:
        an arm;
        a pair of opposed pawls extending from a first end portion of the arm; and
        a latch connected to a second end portion of the arm via an arcuate spring portion, the latch configured to engage the catch portion on the cross-member when the at least one lever is in the closed position.

11. The circuit board actuator of claim 10, wherein the latch includes a release tab operable to disengage the latch from the catch when activated by a user.

12. The circuit board actuator of claim 11, wherein the latch includes a tooth disposed on the release tab configured to engage the catch portion.

13. The circuit board actuator of claim 12, wherein the catch portion comprises a catch groove formed in the cross-member.

14. The circuit board actuator of claim 12, wherein the catch portion comprises a flange extending from the cross-member.

15. The circuit board actuator of claim 10, wherein the pair of opposed pawls include an insertion pawl and an ejector pawl.

16. The circuit board actuator of claim 10, wherein the cross-member is attachable along an edge of the circuit board.

17. The circuit board actuator of claim 10, wherein the cross-member is attachable to a side surface of the circuit board.

18. The circuit board actuator of claim 10, wherein the at least one lever is pivotably coupled to the cross-member by a fastener.

19. The circuit board actuator of claim 18, wherein the fastener is operable to mount the cross-member to the circuit board.

20. The circuit board actuator of claim 10, including a resilient member positioned between the at least one lever and the cross-member to urge the at least one lever toward the open position.

* * * * *